(12) United States Patent
LaRoche et al.

(10) Patent No.: US 8,575,666 B2
(45) Date of Patent: Nov. 5, 2013

(54) METHOD AND STRUCTURE HAVING MONOLITHIC HETEROGENEOUS INTEGRATION OF COMPOUND SEMICONDUCTORS WITH ELEMENTAL SEMICONDUCTOR

(75) Inventors: Jeffrey R. LaRoche, Lowell, MA (US);
Thomas E. Kazior, Sudbury, MA (US);
William E. Hoke, Wayland, MA (US)

(73) Assignee: Raytheon Company, Waltham, MA (US)

( * ) Notice: Subject to any disclaimer, the term of this patent is extended or adjusted under 35 U.S.C. 154(b) by 34 days.

(21) Appl. No.: 13/249,579

(22) Filed: Sep. 30, 2011

(65) Prior Publication Data

US 2013/0082281 A1  Apr. 4, 2013

(51) Int. Cl.
*H01L 31/113* (2006.01)

(52) U.S. Cl.
USPC ............ 257/291; 257/E29.082; 438/34

(58) Field of Classification Search
USPC ............ 257/291, E29.082; 438/34, 23
See application file for complete search history.

(56) References Cited

U.S. PATENT DOCUMENTS

| | | | | |
|---|---|---|---|---|
| 6,541,861 B2* | 4/2003 | Higashi et al. | ............ | 257/751 |
| 2003/0020068 A1 | 1/2003 | Finder | | |
| 2007/0105256 A1* | 5/2007 | Fitzgerald | ............ | 438/34 |
| 2008/0153267 A1 | 6/2008 | Clavelier et al. | | |
| 2008/0268587 A1 | 10/2008 | Sadaka et al. | | |
| 2009/0111236 A1* | 4/2009 | Kakehata et al. | ............ | 438/406 |

OTHER PUBLICATIONS

Notification of Transmittal of the International Search Report and Written Opinion of the International Searching Authority, or the Declaration, PCT/US2012/054112, dated Nov. 20, 2012.
International Search Report, PCT/US2012/054112, dated Nov. 20, 2012.
Written Opinion of the International Searching Authority, PCT/US2012/054112, dated Nov. 20, 2012.
Carlos Mazure, Andre-Jacques Auberton-Herve, Engineering Wafers for the Nanotechnology Era, IEEE, pp. 29-38, Sep. 2005.
N. Bresson, S. Cristoloveanu, C. Mazure, F. Letertre, H. Iwai, Integration of buried insulators with high thermal conductivity in SOI MOSFETs: Thermal properties and short channel effects, Solid-State Electronics, pp. 1522-1528, Sep. 2005.

* cited by examiner

*Primary Examiner* — Matthew Reames
(74) *Attorney, Agent, or Firm* — Daly, Crowley, Mofford & Durkee, LLP (57) ABSTRACT

A semiconductor structure having compound semiconductor (CS) device formed in a compound semiconductor of the structure and an elemental semiconductor device formed in an elemental semiconductor layer of the structure. The structure includes a layer having an elemental semiconductor device is disposed over a buried oxide (BOX) layer. A selective etch layer is disposed between the BOX layer and a layer for a compound semiconductor device. The selective etch layer enables selective etching of the BOX layer to thereby maximize vertical and lateral window etch process control for the compound semiconductor device grown in etched window. The selective etch layer has a lower etch rate than the etch rate of the BOX layer.

10 Claims, 11 Drawing Sheets

METHOD AND STRUCTURE HAVING MONOLITHIC HETEROGENEOUS INTEGRATION OF COMPOUND SEMICONDUCTORS WITH ELEMENTAL SEMICONDUCTOR

TECHNICAL FIELD

This disclosure relates generally to the monolithic heterogeneous integration of compound semiconductors with elemental semiconductor such as Si (as in CMOS) and Ge.

BACKGROUND AND SUMMARY

As is known in the art, recent advances in monolithic heterogeneous integration of compound semiconductor (CS) devices (including Group III-V devices composed of InP, GaAs, GaN, or AlN containing materials) with elemental semiconductor devices, such as Si based CMOS, have enabled compound semiconductor devices to be grown in etched windows on modified silicon on insulator (SOI) substrates and fabricated within a few microns of neighboring CMOS devices. Ideally, the resulting CS devices are co-planar or nearly co-planar with the CMOS in order to enable the use of standard back-end CMOS processing techniques to complete process integration. In this approach, compound semiconductor devices are grown on modified Silicon-On-Insulator (SOI) variants with compound semiconductor growth supports that are one of the following:

the SOI handle substrate (which may be Si, SiC, Sapphire or other elemental or compound semiconductor)

a template layer that has been grown directly on the SOI handle substrate a template layer that was layer transferred to the handle substrate a template layer that has been layered transferred and ends up sandwiched (i.e., buried) between two oxide layers in the SOI.

Generalized outlines of two of these modified SOI variants are shown in FIGS. 1A-1F and 2A-2F, for gallium nitride (GaN) and gallium arsenide (GaAs) or gallium nitride (GaN), respectively, integrated with CMOS. In FIGS. 1A-1F, the GaN/CMOS integration is accomplished by growing the GaN device in a window directly on the window exposed portion of the handle wafer, e.g., Si, SiC, or Sapphire. On the other hand, for the GaAs (or InP)/CMOS integration of FIGS. 2A-2F, the GaAs devices are grown on a window exposed portion of the template layer that is otherwise buried between two oxide layers in the SOI structure. It should be noted that the buried template layer could be any compound or elemental semiconductor such as Si, Ge, InP, GaAs, GaN, or AlN. Alternately, the figures could have been drawn with the GaN devices grown on an exposed portion of the buried template layer, and the GaAs (or InP) devices grown directly on the handle substrate.

Figure 1A:
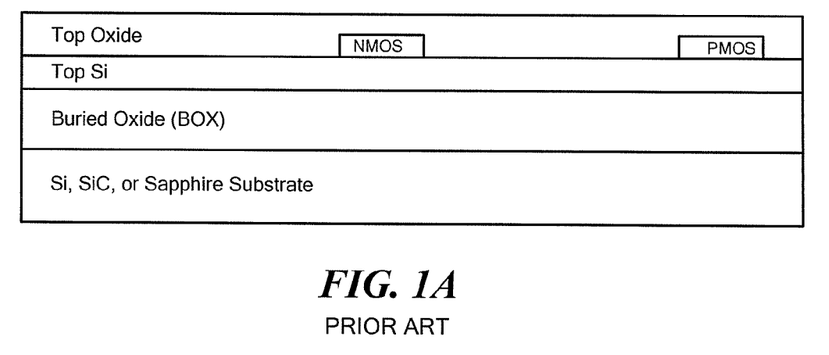
FIGS. 1A through 1F are cross sectional sketches of GaN/CMOS semiconductor structure at various stages in the fabrication thereof according to the PRIOR ART.
Figure 1B:
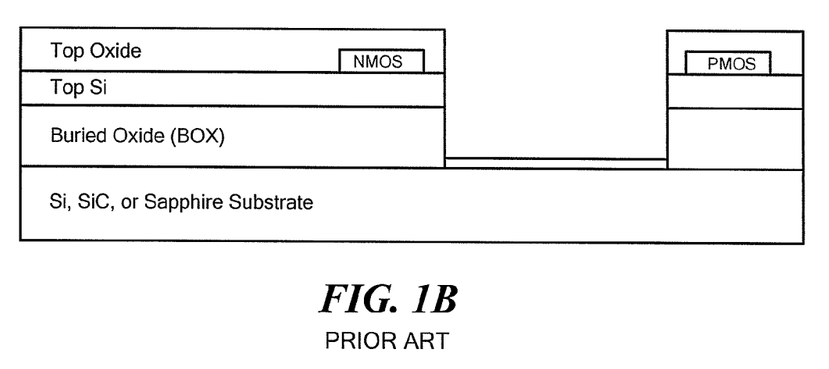
Figure 1C:
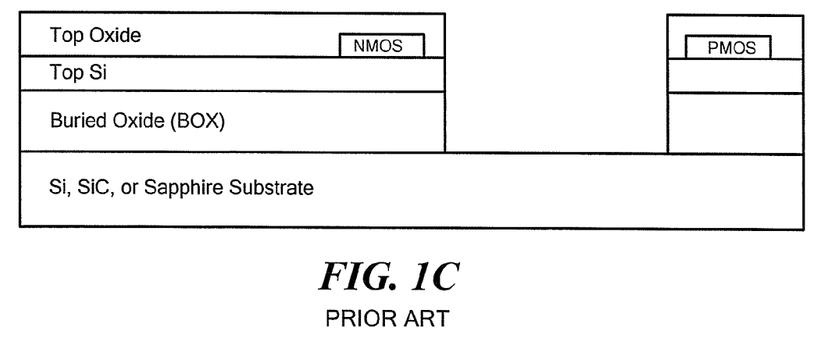
Figure 1D:
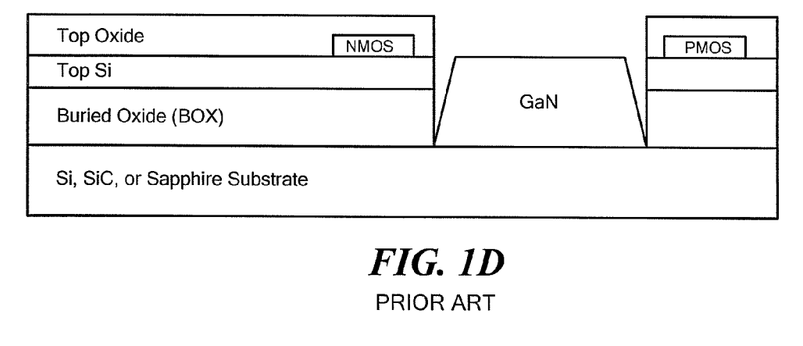
Figure 1E:
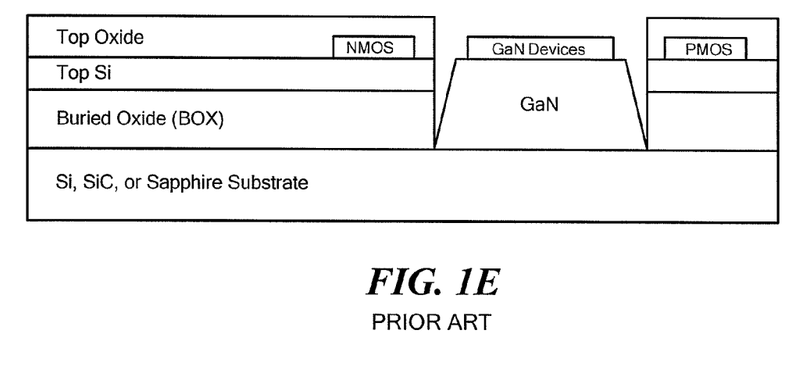
Figure 1F:
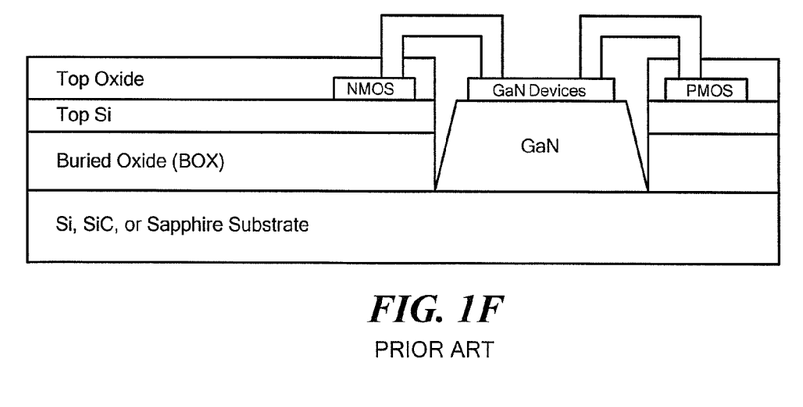

More particularly, it is noted that for both SOI variants, a substrate (or handle) of, for example, silicon, SiC or sapphire is provided with a buried oxide (BOX) layer of silicon dioxide on the surface of the substrate. In the case the GaN structure, a top layer of silicon (Top Si) is formed on the BOX layer and then the CMOS devices are formed in the top silicon layer as shown in FIG. 1F; and in the case of the GaAs or InP structure, a buried CS template layer is sandwiched between a pair of BOX layers (i.e., a lower BOX layer 2 (BOX2) and an upper BOX layer 1 (BOX1) and then the CMOS devices are formed in the top silicon layer, as shown in FIG. 2.

Figure 2A:
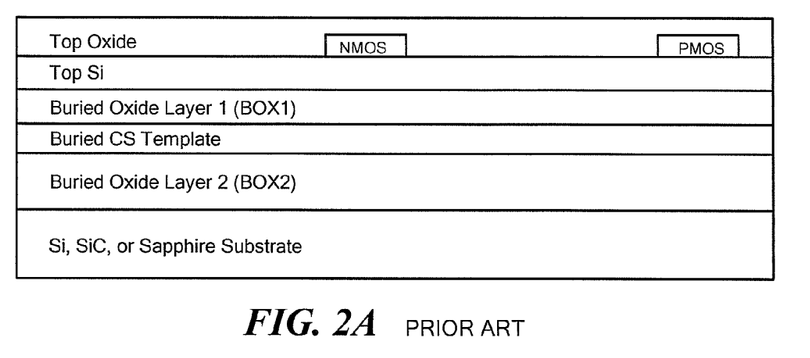
FIGS. 2A through 2F are cross sectional sketches of a GaAs (or InP)/CMOS structure at various stages in the fabrication thereof according to the PRIOR ART.
Figure 2B:
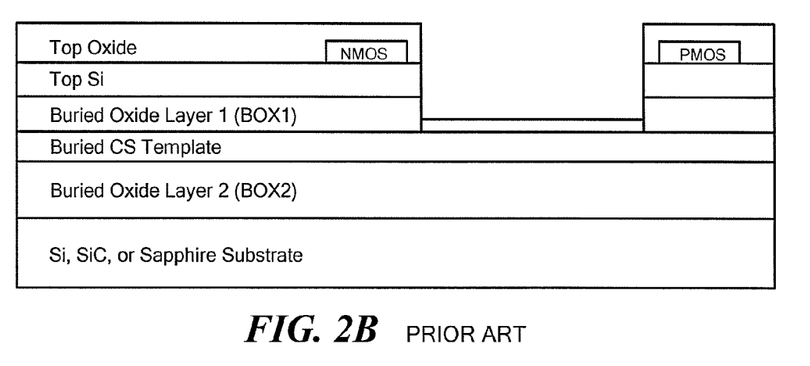
Figure 2B:
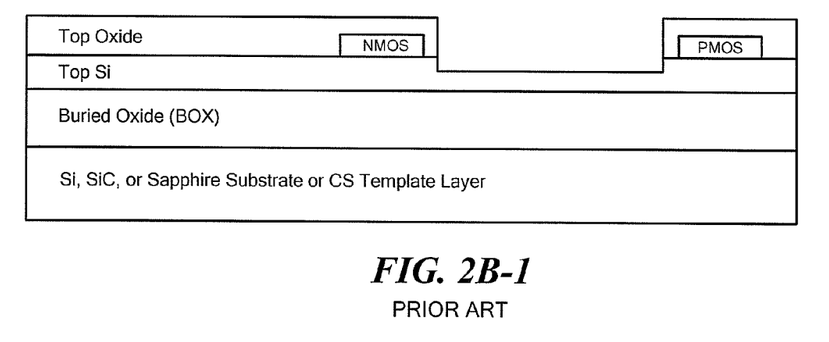
Figure 2B:
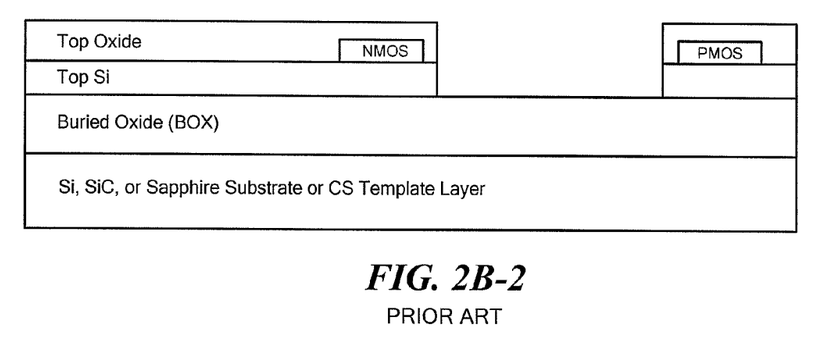
Figure 2B:
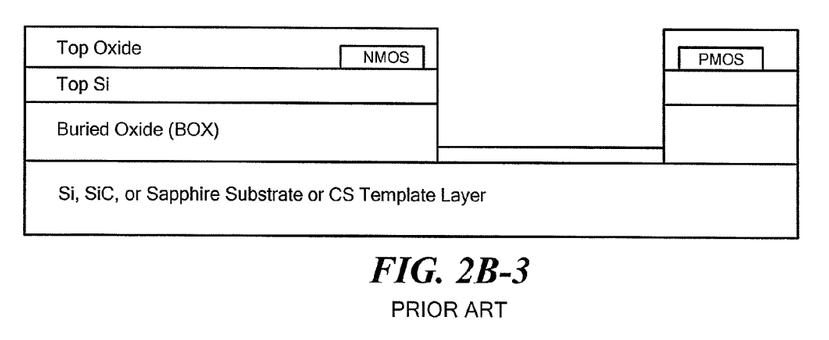
Figure 2C:
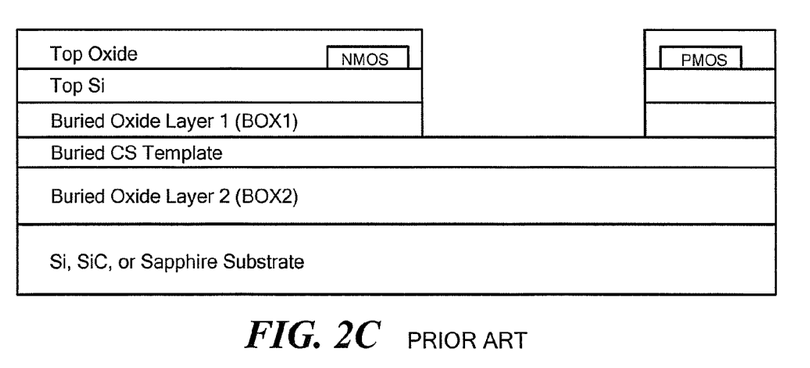
Figure 2D:
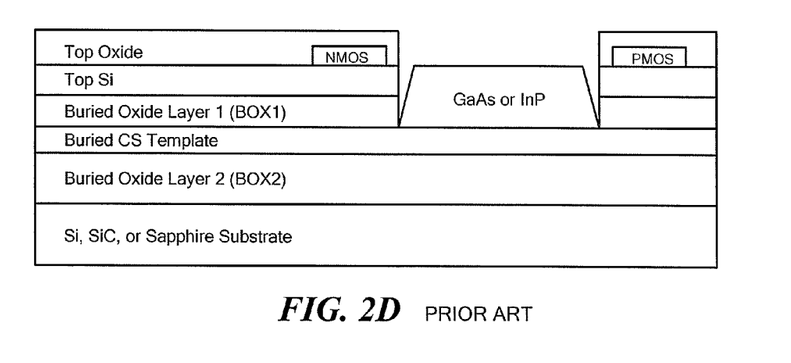
Figure 2E:
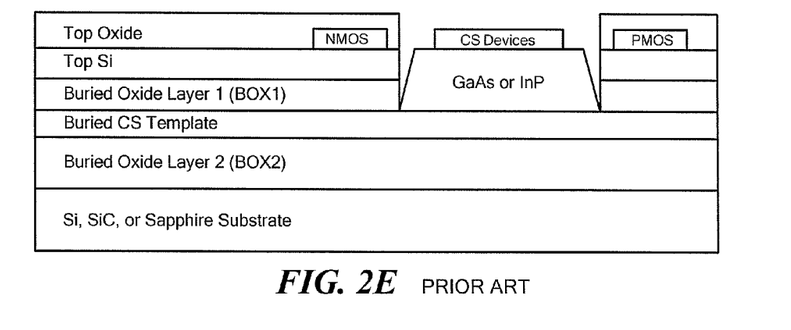
Figure 2F:
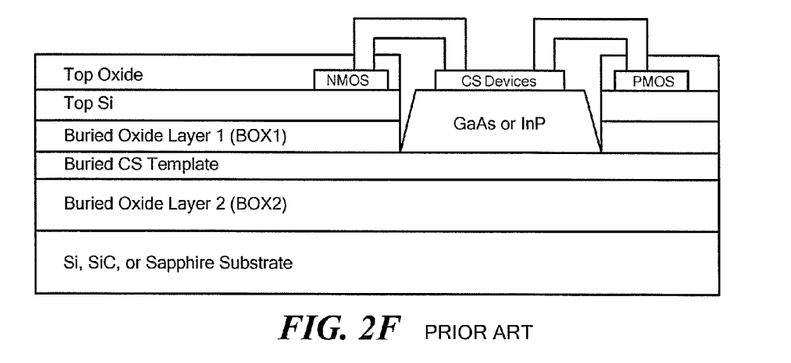

The monolithic approach to heterogeneous integration that is outlined in FIGS. 1A-1F and 2A-2F face many challenges including:

1. vertical and lateral windows etch repeatability
2. the impact of CS growth temperatures on CMOS device parameters
3. impact of growing CS devices on non-native substrates and templates on CS device reliability
4. layer cross contamination during SOI wafer manufacture, III-V growth, and process anneal steps
5. CS to CMOS heterogeneous interconnect fabrication As mentioned above, heterogeneous integration on modified SOI wafers (as shown in FIGS. 1A-1F and 2A-2F) suffers from limited process control/repeatability related to etching windows into the SOI so that CS devices can be grown. The limited process control/repeatability of the windows etching process impacts two areas that are the following:

1. the quality of the CS devices grown
2. the minimum possible spacing between CMOS and CS devices The process shown in FIG. 2B above is shown in more detail in FIGS. 2B-1 through 2B-3. Thus, as shown in FIG. 2B-1, the top oxide layer is first etched with a fluoride containing plasma. The etch is a non-selective etch and penetrates into the Top Si. Next, a fluoride-oxide containing plasma is used to selectively remove the remaining Top Si and selectively expose the BOX layer, as shown in FIG. 2B-2. Next, the upper portion of the exposed BOX layer is dry etched with fluoride containing plasma (as shown FIG. 2B-3); it being noted that a thin portion of the BOX layer remains. This thin BOX layer is then removed with a final wet HF etch.

The inventors have recognized that both of these issues stem from the fact that in order to achieve the minimum spacing between CMOS and CS devices, one must dry etch most of the Top oxide/Top Si/BOX stack and leave a minimal amount of BOX (above the CS template surface).

The final wet etch removal of a thin residual BOX layer is necessary because in most cases complete dry etch removal of the buried oxide would result in a damaged template surface for CS growth. This in turn would result in higher defects in the CS devices that may suffer from performance and reliability issues (impacting area 1 above). On the other hand, the hydrofluoric acid solutions used for final BOX removal will substantially laterally etch both the top oxide layers (above the CMOS) and BOX if wet etch times are long (impacting area 2 above). As a result, the amount of BOX left after the dry etch process should be as thin as possible, so as to minimize wet etch times.

A poorly controlled dry etch of the BOX could result in either an over etch of the BOX resulting in a complete dry etch process (impacting area 1 above), or in an under etch of the BOX that would leave more oxide than expected for wet etch removal (impact areas 1 or 2 above). If the wet etch time of the under dry etched case is not adjusted, and residual oxide is present in the windows, then the CS devices will fail to nucleate properly during growth (impacting area 1 above) in windows. If the wet etch time is adjusted to remove the oxide, but it is lengthened too much, than the lateral etching of the oxide may be excessive (impacting area 2 above)

In accordance with the present disclosure, a layer having an elemental semiconductor device is disposed over a buried oxide (BOX) layer. A selective etch layer is disposed between the elemental semiconductor device layer and a layer for a compound semiconductor device. The selective etch layer enables selective etching of the BOX layer to thereby maximize vertical and lateral window etch process control for the compound semiconductor device grown in the etched window.

In one embodiment, a semiconductor structure is provided having CMOS transistor and a compound semiconductor device. The structure includes: a compound semiconductor growth support for the compound semiconductor having the compound semiconductor device therein; a selective etch layer on the compound semiconductor growth support; and a silicon layer disposed over the selective etch layer, the silicon layer having disposed in portions thereof the CMOS transistors. A window formed through other portions of the silicon layer and underlying portions of the selective etch layer exposes a portion of the compound semiconductor growth support. The compound semiconductor is disposed over the exposed portion of the compound semiconductor growth support.

In one embodiment, the selective etch layer is aluminum oxide (Al2O3), silicon nitride (SiNx), aluminum nitride (AlN), hafnium oxide, or zirconium oxide or a plurality of layers having combinations of aluminum oxide (Al2O3), silicon nitride (SiNx), aluminum nitride (AlN), hafnium oxide, or zirconium oxide.

In one embodiment, the compound semiconductor growth support is silicon (Si), SiC or sapphire.

In one embodiment, the compound semiconductor growth support is a compound or elemental semiconductor.

In one embodiment, the compound semiconductor growth support is Ge, InP, GaAs, GaN, or AlN.

The overall thickness of the selective etch layer or layers and the remaining buried oxide are selected to minimize or eliminate any additional buried oxide thickness relative to typical SOI buried oxide thicknesses, which, in turn, widens the process windows available during modified SOI manufacture, CS/CMOS process integration, and CS growth processes.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 2B-1 through 2B-3 are cross sectional sketches showing in more detail the steps used in fabrication of the structure shown in FIG. 2B according to the PRIOR ART;

Like reference symbols in the various drawings indicate like elements.

DETAILED DESCRIPTION

Figure 3:
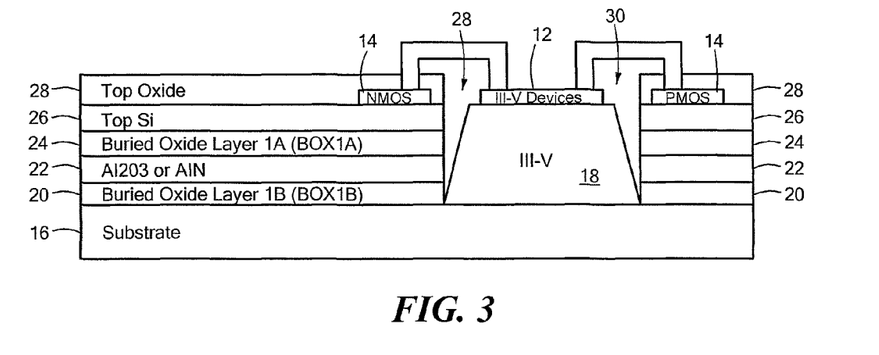
FIG. 3 is a cross sectional sketch of a semiconductor structure having compound semiconductor (CS) device and an elemental semiconductor device according to the disclosure.
Figure 3A:
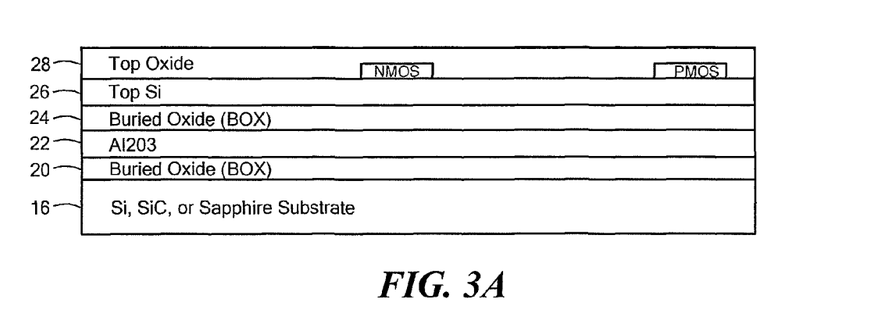
FIGS. 3A-3F are cross sectional sketches of the semiconductor structure of FIG. 3 at various stages in the fabrication thereof according to the disclosure.
Figure 3B:
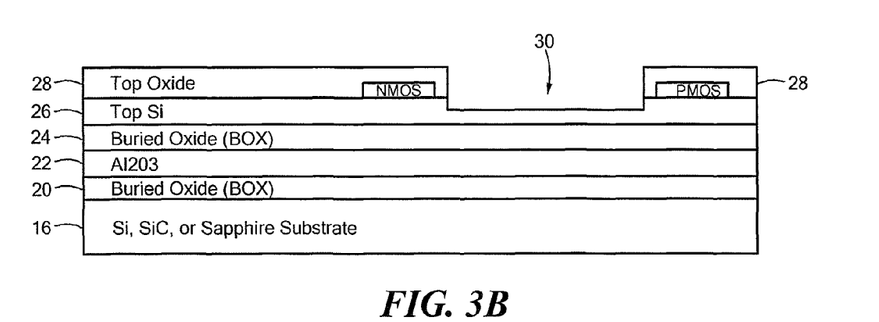
Figure 3C:
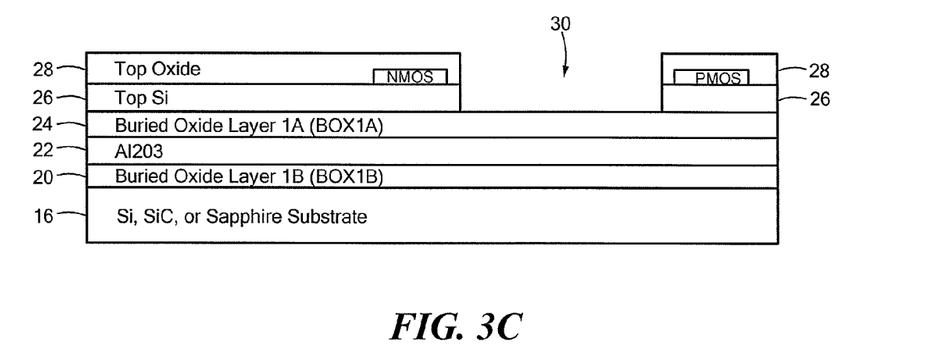
Figure 3D:
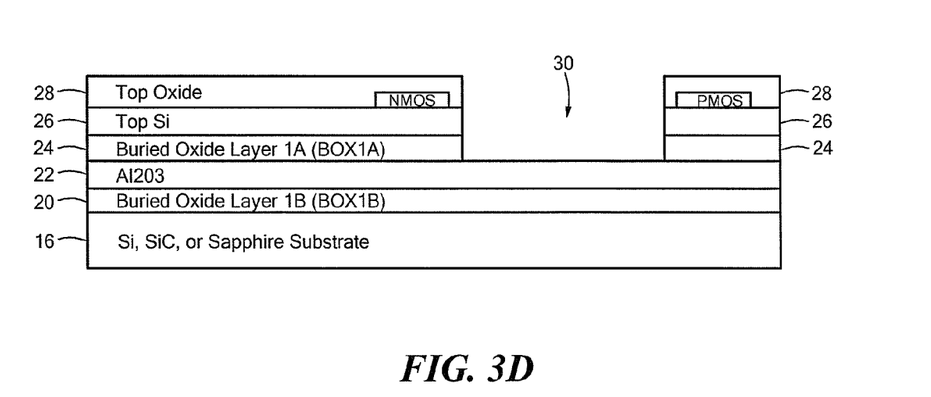
Figure 3E:
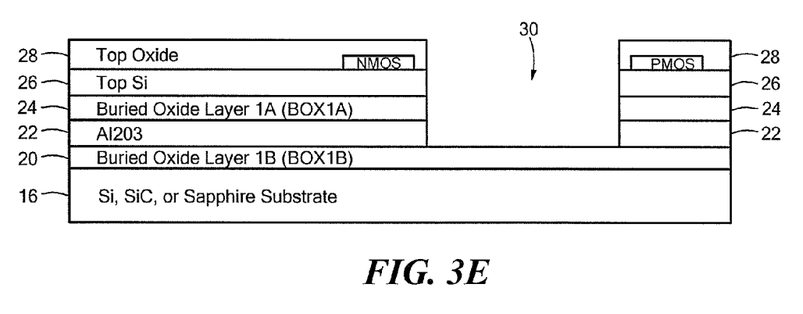
Figure 3F:
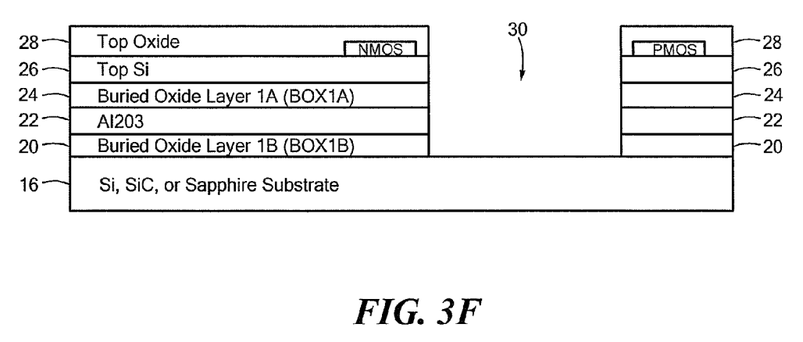

Referring now to FIG. 3, a cross sectional sketch of a semiconductor structure 10 having compound semiconductor (CS) device 12, here for example, a III-V device formed in a compound semiconductor 18, such as, for example, a GaAs, GaN or InP transistor and an electrically connected elemental semiconductor device 14, here for example a pair of silicon devices, more particularly CMOS transistors, formed in an elemental semiconductor layer 26 is shown.

After formation of the elemental semiconductor devices 14 and a top silicon dioxide layer 28, and prior to the formation of the compound semiconductor (CS) device, a structure is provided having compound semiconductor growth layer or support 16 (sometimes also referred to herein as substrate 16), here a substrate of, for example, silicon, SiC or sapphire. The support 16 has disposed on the upper surface thereof a first buried oxide (BOX) layer 20 of silicon dioxide. A selective etch layer 22, here for example, aluminum oxide ($Al_2O_3$) or aluminum nitride (AlN), is disposed on the selective etch layer 22. A second buried oxide (BOX) layer 24 of silicon dioxide is disposed on selective etch layer 22. A top elemental semiconductor layer 26, here silicon is disposed on the second buried oxide (BOX) layer 24. A top silicon dioxide layer 28 is disposed on the top elemental semiconductor layer 26.

Referring now to FIGS. 3A-3F, a window 30 is then formed through layers 28, 26, 24, 22, and 20 to expose a portion of the compound semiconductor growth support or substrate 16 for compound semiconductor 18. More particularly, the window 30 is formed using a series or sequence of etches. First, a non-selective, fluoride containing plasma dry etch is used to remove portions of the top silicon dioxide layer 28 and expose an underlying portion of the top silicon layer 26. Next, a selective fluorine-oxygen containing plasma dry etch is used to remove the underlying portions of the top silicon layer 26 to thereby expose underlying portions of the second buried oxide layer 24. Next, a selective fluorine containing plasma etch is used to remove the underlying portions of the second buried oxide layer 24. It is noted that the second buried oxide layer 24 etch rate is much higher than the etch rate of the underlying portions of the selective etch layer 22 in fluorine containing plasmas. The selective etch layer 22 (sometimes also referred to herein as an etch stop layer) acts as an etch stop during BOX dry etch, then occurs one of the following depending on the modified SOI variant: the etch stop layer 22 is then selectively dry etched to reveal the final layer which is to be wet etched; or the etch stop layer 22 itself is wet etched to reveal the III-V growth surface.

The current example outlined in FIGS. 3A-3F is the former of the two selective etch cases, so a $BCl_3/Cl_2$ gas chemistry selective etch is used to remove the underlying portions of the selective etch layer 22 to thereby expose underlying portions of buried oxide layer 20. Next a wet etch, here for example, a hydrofluoric acid containing solution is used to remove the exposed portions of the first buried oxide layer 20 and thereby expose a portion of the compound semiconductor growth support 16. Next, the compound semiconductor 18 is formed on the exposed portion of the support 16. Next, the compound semiconductor (CS) device 12 is formed in the upper portion of the compound semiconductor 18. The completed structure is shown in FIG. 3.

Figure 4:
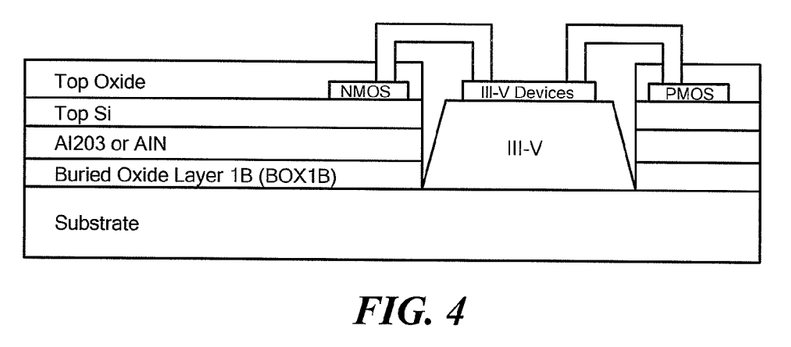
FIGS. 4 through 9 are cross sectional sketches of a semiconductor structures having compound semiconductor (CS) device and an elemental semiconductor device therein according to other embodiments of the disclosure.
Figure 5:
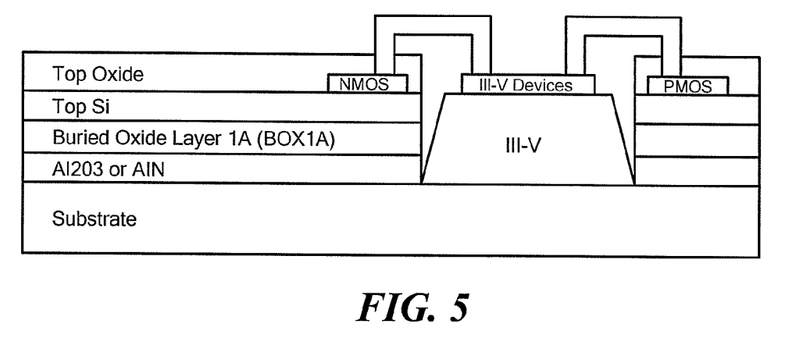
Figure 6:
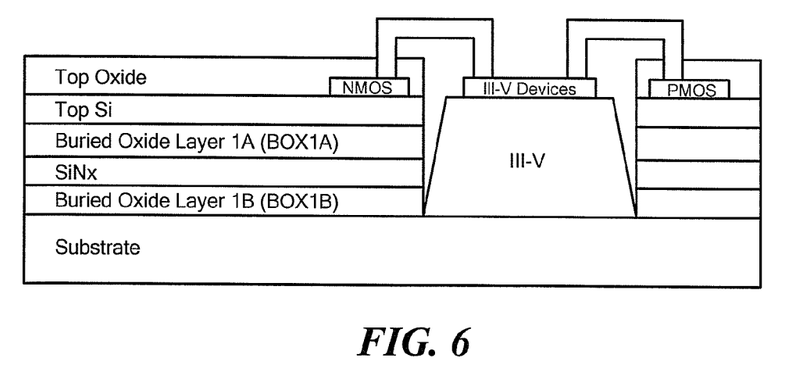
Figure 7:
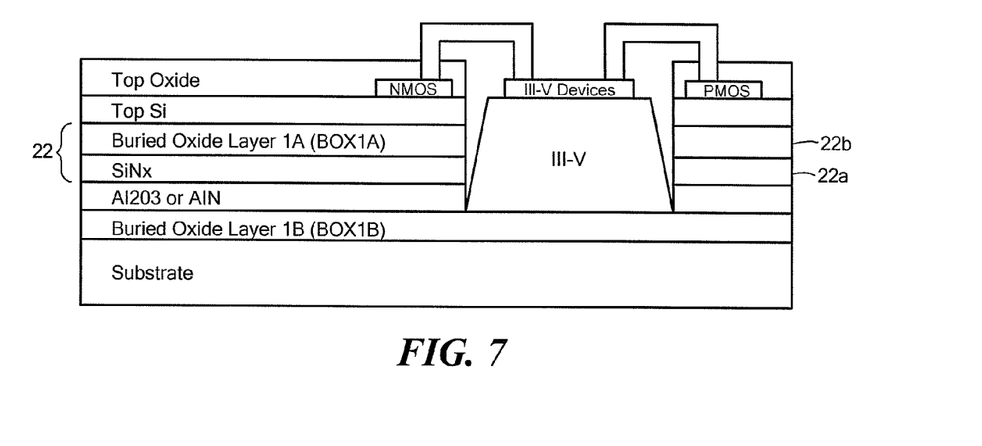
Figure 8:
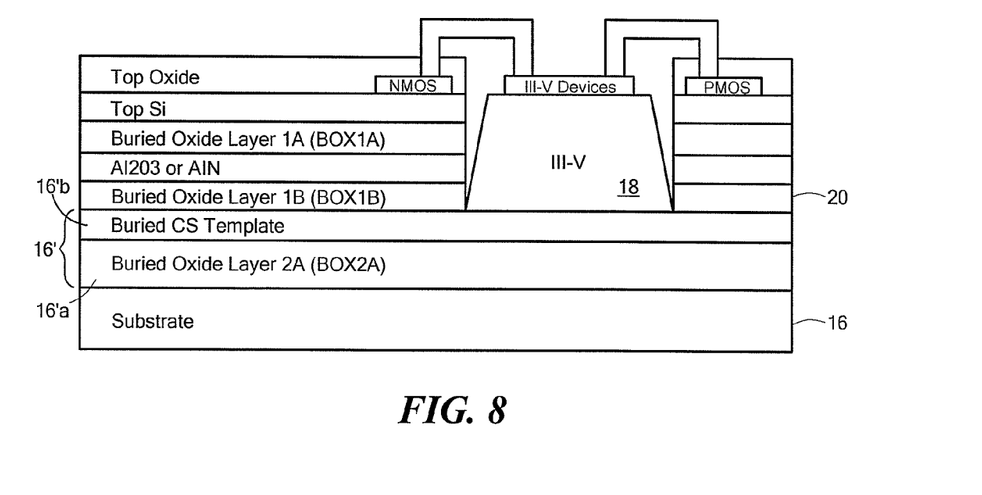
Figure 9:
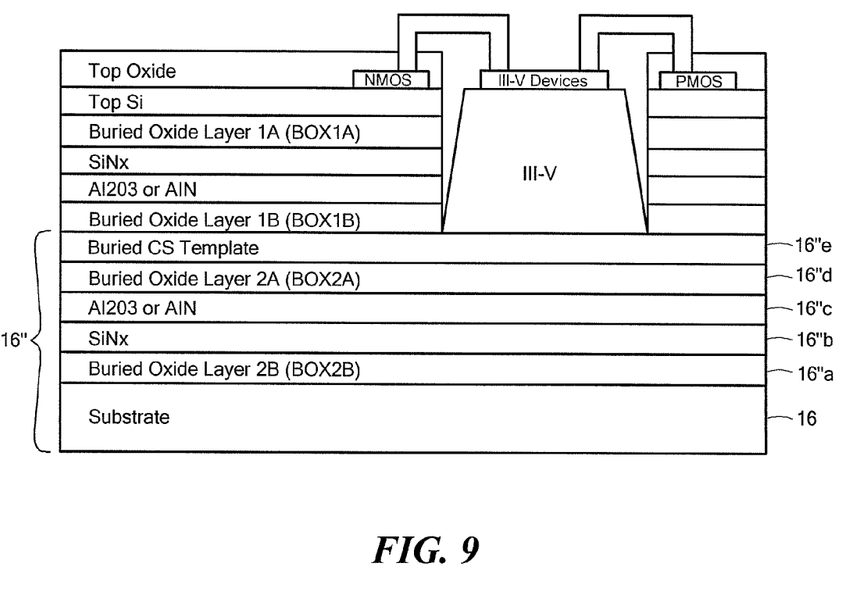

From this baseline modified SOI structure and approach to windows etching additional variants can be derived. Many more variants are shown in FIGS. 4-9. In FIG. 4, the second buried oxide layer 26 is removed from FIG. 3. In FIG. 5, the first buried oxide layer 20 is removed from FIG. 3. In FIG. 6, the etch layer 22 is silicon nitride (SiNx). In FIG. 7, the etch layer 22 is a composite layer of lower layer 22a of $Al_2O_3$ or AlN and an upper layer 22b of SiNx. The SiNx layer is also etched in fluorine containing plasmas, but its etch rate is manipulated relative to the other layers through its deposition method and conditions, subsequent thermal treatment, and composition of fluorine gas chemistry used to etch SiNx. It should be understood that the variations in FIGS. 4 through 6 may be used with the composite layers 22a, 22b for the etch layer 22. In FIG. 8 the compound semiconductor growth support 16' for the compound semiconductor 18 is a buried compound semiconductor (CS) template (compound semiconductor growth support) layer 16'b disposed on an additional buried oxide layer 16'a. The compound semiconductor growth support 16' is on the substrate 16, as shown. It should be understood that all of the variations described above in FIGS. 3 through 7 may be used in the structure shown in FIG. 8. In FIG. 9, the compound semiconductor growth support 16" for the compound semiconductor 18 is a buried oxide layer 16"a on the substrate 16, a SiNx layer 16"b on the buried oxide layer 16"a, an Al2O3 or SiN layer 16"c on the SiNx layer 16"b, a buried oxide layer 16"d on the Al2O3 or SiN layer 16"c. and a buried compound semiconductor (CS) template (compound semiconductor growth support) layer 16"e disposed on the buried oxide layer 16"d. It should be understood that all of the variations described above in FIGS. 3 through 8 may be used in the structure shown in FIG. 9.

The SiNx in this additional BOX stack is deposited by plasma enhanced chemical vapor deposition (PECVD), chemical vapor deposition (CVD), or by atomic layer deposition (ALD). The aluminum oxide ($Al_2O_3$) layer is deposited by ALD, sputter deposition, thermal oxidation of aluminum to $Al_2O_3$, or by PECVD as part of the buried oxide layer formation of the modified SOI fabrication process. Finally, the $SiO_2$ in this stack can be thermal $SiO_2$, if the CS growth surface is Si, or PECVDSiO$_2$ if the CS growth surface is a non-Si template layer.

The SiNx also provides wet and dry etch selectivity relative to the $SiO_2$ and $Al_2O_3$ and thereby help minimize lateral process bias caused the dry and wet etching windows processes. The $Al_2O_3$ (primarily etched $BCl_3/Cl_2$ containing plasmas) and $SiO_2$ (primarily etched fluorine containing plasmas) on the other hand, act primarily as selective dry etch stops relative to each other. Nitrided interfaces may be used in place of SiNx. Surfaces may be nitrided through $NH_3$, $N_2$, or other nitrogen containing gas plasma treatments.

A number of embodiments of the disclosure have been described. Nevertheless, it will be understood that various modifications may be made without departing from the spirit and scope of the disclosure. For example, the selective etch layer may be silicon nitride (SiNx), aluminum nitride (AlN), hafnium oxide, or zirconium oxide or a plurality of layers having combinations of aluminum oxide (Al2O3), silicon nitride (SiNx), aluminum nitride (AlN), hafnium oxide, or zirconium oxide. Further, different dielectric layers, such as a silicon nitride layer, may be used in place of the BOX layer 24. Accordingly, other embodiments are within the scope of the following claims.

What is claimed is:

1. A semiconductor structure comprising:
    a column III-V compound semiconductor growth support;
    a column III-V compound semiconductor device disposed on the support;
    a dielectric layer;
    a silicon layer having a CMOS semiconductor device disposed over the dielectric layer;
    a selective etch layer disposed between the dielectric layer and the support; and
    wherein the selective etch layer has a lower etch rate to a fluorine containing plasma etch than the etch rate of the dielectric layer has to the fluorine containing plasma etch; and
    wherein the selective etch layer is aluminum oxide (Al2O3), or aluminum nitride (AlN), or a plurality of layers having combinations of aluminum oxide (Al2O3), and aluminum nitride (AlN).

2. The semiconductor structure recited in claim 1 wherein the support is silicon, SiC or sapphire.

3. The semiconductor structure recited in claim 1 wherein the support is a compound or elemental semiconductor.

4. The semiconductor structure recited in claim 1 wherein the support is Si, Ge, InP, GaAs, GaN, or AlN.

5. The semiconductor structure recited in claim 1 wherein the dielectric layer is silicon dioxide.

6. The semiconductor structure recited in claim 1 wherein the silicon layer is disposed over the selective etch layer, the silicon layer having disposed in portions thereof the column III-V semiconductor layer; and wherein the structure has a window formed through other portions of the silicon layer and underlying portions of the selective etch layer exposes a portion of the support; and
    wherein the column III-V semiconductor layer is disposed on the exposed portion of the support.

7. A semiconductor structure having CMOS transistors and a compound semiconductor device, comprising:
    a column III-V semiconductor growth support;
    a column III-V semiconductor device disposed on the support;
    selective etch layer is disposed over the compound semiconductor growth support;
    wherein the selective etch layer has a lower etch rate to a fluorine containing plasma etch than the etch rate of the dielectric layer has to the fluorine containing plasma etch,
    wherein the selective etch layer is aluminum oxide (Al2O3), aluminum nitride (AlN), or a plurality of layers having combinations of aluminum oxide (Al2O3), aluminum nitride (AlN);
    a silicon layer is disposed over the selective etch layer, the silicon layer having disposed in portions thereof the CMOS transistors;
    wherein a window formed through other portions of the silicon layer and underlying portions of the selective etch layer exposes a portion of the compound semiconductor growth support; and
    wherein the compound semiconductor is disposed on the exposed portion of the compound semiconductor growth support.

8. The semiconductor structure recited in claim 7 wherein the support is silicon, SiC or sapphire.

9. The semiconductor structure recited in claim 7 wherein the support is a compound or elemental semiconductor.

10. The semiconductor structure recited in claim 7 wherein the support is Si, Ge, InP, GaAs, GaN, or AlN.

* * * * *